United States Patent
Sauk

(10) Patent No.: US 7,098,529 B1
(45) Date of Patent: Aug. 29, 2006

(54) SYSTEM AND METHOD FOR PACKAGING A SEMICONDUCTOR DEVICE

(75) Inventor: Frank Sauk, San Ramon, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/753,945

(22) Filed: Jan. 7, 2004

(51) Int. Cl.
*H01L 23/495* (2006.01)

(52) U.S. Cl. .................. 257/676; 257/680; 438/106; 438/121

(58) Field of Classification Search ............. 257/676, 257/680, 688, 678, 738, 784, 783, 788; 438/106, 438/121
See application file for complete search history.

(56) References Cited

U.S. PATENT DOCUMENTS

| | | | |
|---|---|---|---|
| 5,804,870 A * | 9/1998 | Burns ................ | 257/666 |
| 6,232,652 B1 * | 5/2001 | Matsushima ........... | 257/667 |
| 6,326,678 B1 * | 12/2001 | Karnezos et al. ...... | 257/666 |
| 6,750,551 B1 * | 6/2004 | Frutschy et al. ....... | 257/785 |
| 2002/0185746 A1 * | 12/2002 | Park .................. | 257/776 |
| 2004/0080029 A1 * | 4/2004 | Chow et al. .......... | 257/676 |
| 2004/0188815 A1 * | 9/2004 | Aizawa ............... | 257/678 |
| 2004/0188819 A1 * | 9/2004 | Farnworth et al. ..... | 257/686 |

OTHER PUBLICATIONS

Siva Kolachina, Kendall Scott Wills, Tim Nagel, Aswin Mehta, Rand Carawan, Omar Diaz de Leon, James Grund, Charles Todd, Kartik Ramanujachar, Sundari Nagarathnam—Texas Instruments, Stafford, USA. Christine Charpentier, Daniel Gobled—Texas Instruments, Nice, France. Willmar Subido—Texas Instruments, Dallas, USA. "Optical Waveform Probing—Strategies for Non-Flipchip Devices and Other Applications".

* cited by examiner

Primary Examiner—Douglas W. Owens

(57) ABSTRACT

A package optimized for thinning of an attached semiconductor die. The package comprises an extension ring attached to a bottom surface of the package, and a die carrier plate attached to the extension ring for receiving a semiconductor die. The die carrier plate may be attached to the extension ring by an adhesive that permits removal of the carrier plate from the semiconductor die and extension ring by a small applied force after encapsulation of the semiconductor die. The encapsulant may include a filler material for modifying properties such as hardness, thermal coefficient of expansion, thermal conductivity. The materials used for the extension ring and encapsulant may be selected for compatibility with the die lapping operation.

20 Claims, 8 Drawing Sheets

SYSTEM AND METHOD FOR PACKAGING A SEMICONDUCTOR DEVICE

FIELD OF THE INVENTION

The present invention relates to semiconductor device packaging. More specifically, the invention is directed to packaging of semiconductor devices for die thinning operations.

BACKGROUND ART

The development of backside optical probing techniques for integrated circuits was initially driven by the adoption of flipchip packaging. Since flipchip devices are mounted with the top surface of die in contact with package, visual access is typically limited to the backside of the die.

Optical waveform probing for timing analysis, and failsite isolation techniques such as Photon Emission Microscopy (PEM), Optical Beam Induced Current (OBIC), Light Induced Voltage Alteration (LIVA), Thermally Induced Voltage Alteration (TIVA), Schlieren Thermal Mapping (STM), Fluorescence Microthermal Imaging (FMI), may be applied to the backside of an integrated circuit.

Although many optical probing techniques were initially developed with flipchip devices in mind, the increased complexity and density of interconnect layers of non-flipchip devices have made backside optical probing desirable for non-flipchip devices as well.

In contrast to flipchip devices in which the backside is generally accessible, packaged non-flipchip devices require partial removal of the package to obtain access to the backside of the die. It is also advantageous to reduce the thickness of the die.

Prior Art FIG. 1A shows a cross-section view 100 of a conventionally packaged integrated circuit die 125. The integrated circuit die 125 is mounted on a heat sink/base 105 that is attached to a frame 110. A trace 115 is embedded in the frame 110 and provides a signal path between a ball 120 and a wirebond 130. An encapsulant (e.g., epoxy) 145 covers the die 125.

With respect to the packaged integrated circuit 100, there are four principal surfaces (or planes) of concern: the die mounting surface 106, the package bottom surface 107, the package wirebonding surface 135 and the die top surface 140. The relationship between the four surfaces is generally determined by circuit performance and assembly requirements. Ease of modification for optical probing or other backside operations has not been a primary consideration.

Prior Art FIG. 1B shows a cross-section view 101 of the packaged integrated circuit of FIG. 1A after thinning. The thinned packaged integrated circuit has the heat sink removed (e.g., by lapping) to expose the die 125, with the encapsulant 145 providing mechanical support.

The conventional package of FIG. 1B has the disadvantage of an inherent minimum thickness $T_{min}$ for the thinned die 125. $T_{min}$ is approximately the difference in height between the die top surface 140 and the package wirebonding surface 135. Thinning below $T_{min}$ will result in the removal of trace 115 and an open circuit.

Another disadvantage is the effort required to remove heat sink 105, and thin frame 110. For mechanical thinning operations such as lapping or polishing the presence of the frame 110 may degrade the quality of the surface finish obtained on the die 110. Due to the difference in properties between the die 125 and the heat sink 105, two distinct lapping processes are typically required. The time required for lapping is also increased due to the additional material that must be removed.

Prior Art FIG. 1C shows a cross-section view 102 of a conventional pin grid array (PGA) package with a semiconductor die 125. The PGA package includes a base 150 that supports a trace 155 that connects a wirebond 160 to a pin 165. The base 150 has a mounting region 160 for supporting the semiconductor die 125.

Alternatively specialized tools are used to remove only the section of heat sink below the semiconductor die. While this reduces the minimum thickness $T_{min}$, it has a number of limitations. The most significant of these is the cavity that is created. Optical probing typically requires a wide (e.g., 1 inch) lens to sit very near, or in contact with, the thinned substrate. This means that the lens must be used inside the cavity, which limits its lateral movement. In turn, the full die is no longer visible.

SUMMARY OF INVENTION

Accordingly, embodiments of the present invention provide a system and method for packaging a semiconductor die that has no inherent limitation on finished die thickness. Embodiments of the present invention also provide control over die thinning operations through the selection of materials exposed to the lapping process.

In an embodiment of the present invention, a package for a semiconductor device is provided. The package comprises an extension ring attached to a bottom surface of the package, and a die carrier plate attached to the extension ring for receiving a semiconductor die. The die carrier plate is attached to the extension ring by an adhesive that permits removal of the carrier plate from the semiconductor die and extension ring after encapsulation of the semiconductor die.

In another embodiment, a method is disclosed for adapting a semiconductor device package for optical probing. A conventional semiconductor device package is machined to remove a portion of its die mounting surface and provide an opening. An extension ring is attached to surround the opening, and a die carrier plate is attached to the extension ring. A semiconductor die is attached to the die carrier plate and encapsulated after wirebonding of the die. After encapsulation, the carrier plate is removed and the die thinned by lapping. The materials used for the extension ring and encapsulant may be selected for compatibility with the die lapping operation. Control over the ring thickness enables minimization of the final thickness while maintaining the ability to effectively wirebond in a recess.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

Prior Art

Prior Art

Prior Art

DESCRIPTION OF THE PREFERRED EMBODIMENTS

In the following detailed description of the present invention, a system and method for packaging a semiconductor device, numerous specific details are set forth in order to provide a thorough understanding of the present invention. However, it will be obvious to one skilled in the art that the present invention may be practiced without these specific details. In other instances well known methods involving well-known assembly techniques, components, interconnects, interfaces, etc., have not been described in detail so as not to unnecessarily obscure aspects of the present invention.

Figure 2:
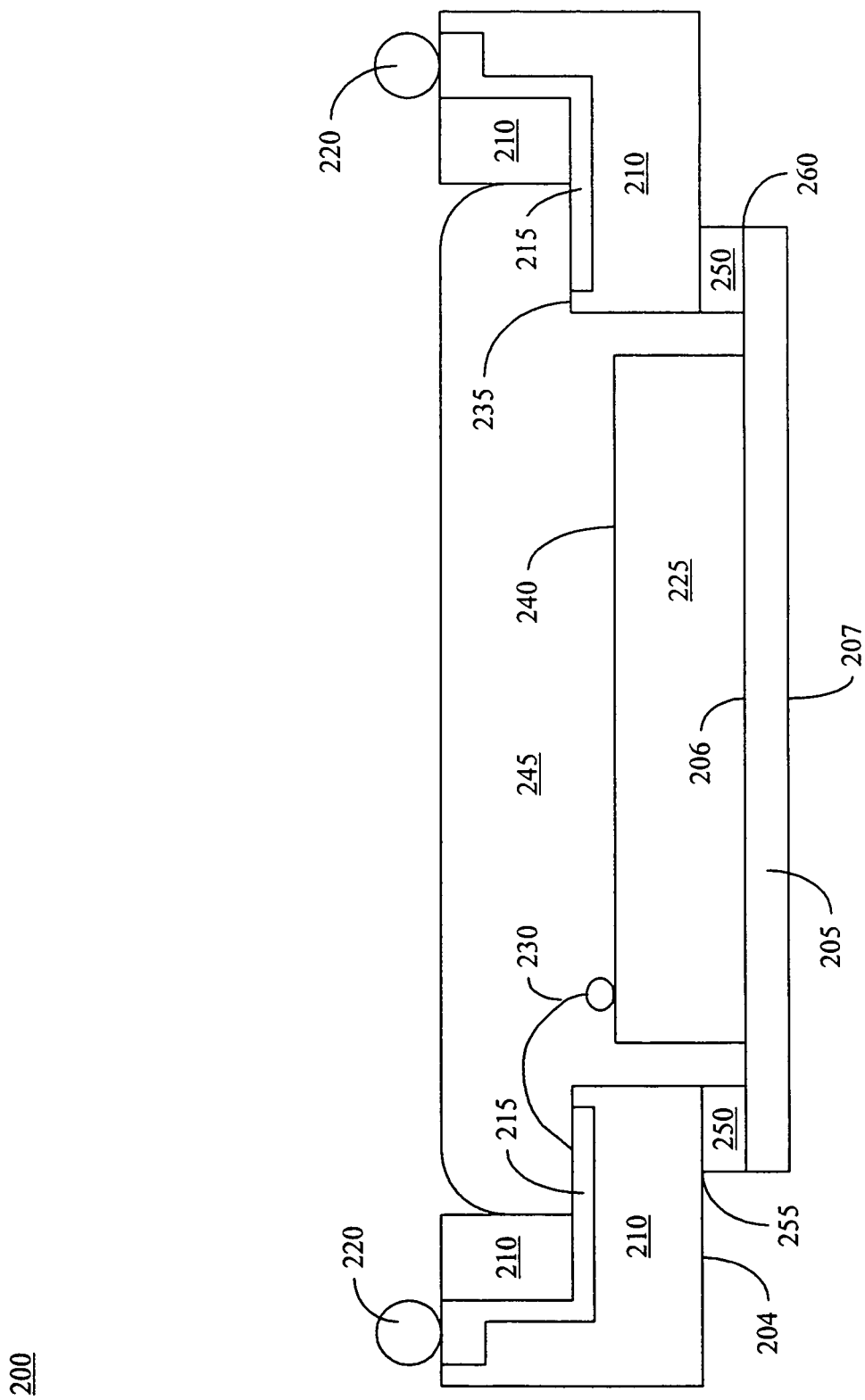
FIG. 2 shows a BGA semiconductor device package in accordance with an embodiment of the present claimed invention.

FIG. 2 shows a packaged semiconductor device 200 in accordance with an embodiment of the present invention. A frame 210 supports a trace 215 that provides an electrical path between a wirebond 230 and a solder ball 220. An extension ring 250 is shown attached to the frame 210. The extension ring 250 is attached to the frame 210 surrounding an opening in the frame 210. In another embodiment, the extension ring 250 is fabricated as a feature of the frame instead of being attached.

The attached extension ring may be attached to the frame 210 using an adhesive, solder, or braze material at interface 255. A die carrier plate 205 is attached to the extension ring 250. The die carrier plate 205 includes a mounting region for supporting a semiconductor die 225. An encapsulant 245 may be applied to encapsulate the semiconductor die 225. The die carrier plate 205 is preferably attached to the extension ring 250 at interface 260 with a temporary adhesive (e.g., double-sided tape or thermoplastic), or other means of fastening that allows for subsequent removal of the carrier plate from an encapsulated assembly with a small applied force. It is desirable that the extension ring be flat and have a uniform thickness so that the die attach surface that is provided on the carrier plate is essentially parallel to the original die attach surface.

The die 225 may be attached to the carrier plate 205 at interface 206 using the same means of attach used at interface 260 (e.g. double-sided tape). Alternatively, a first thermoplastic adhesive may be used at interface 260 and a second thermoplastic adhesive with a different flow temperature may be used at interface 206. Although the bonds at interfaces 260 and 206 are temporary, they should be compatible with the wirebonding operation used to attach the wirebond 230 and the process used to form the encapsulation 245.

The encapsulation 245 may be a filled epoxy or other polymer material. The encapsulation may be applied in a vacuum environment and subjected to a higher pressure environment prior to setting in order to minimize voids. A fill material may be selected for enhanced thermal conductivity or for thermal expansion match to the semiconductor die 225. The fill material may also be selected to optimize the lapping characteristics of the encapsulant 245 with respect to the semiconductor die 225.

Figure 1A:
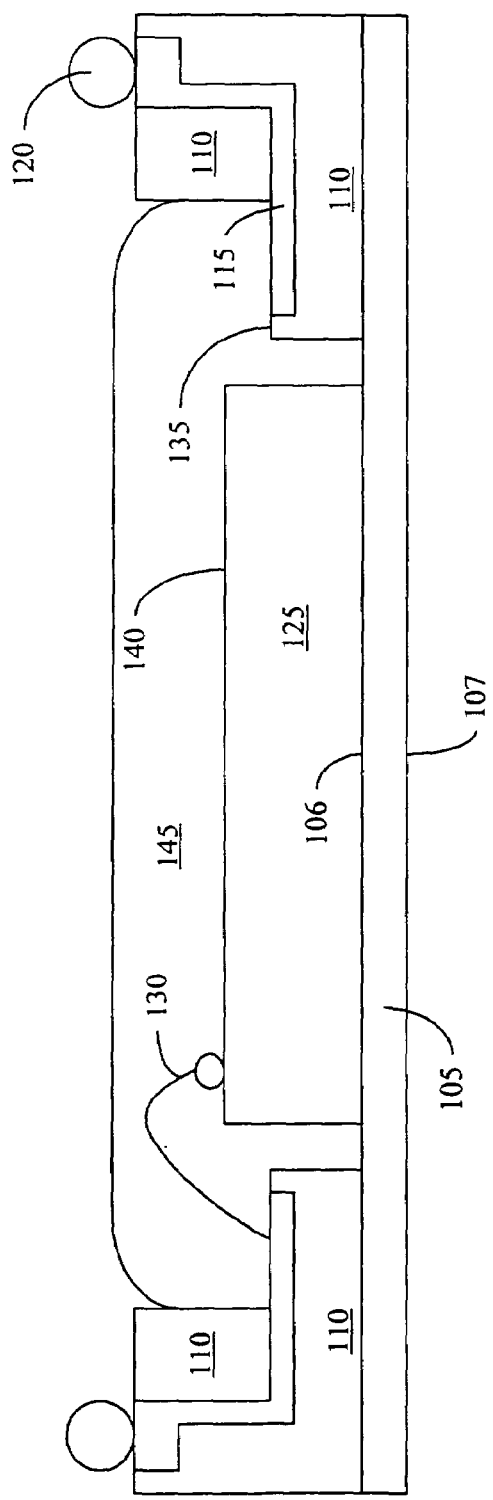
FIG. 1A shows an encapsulated conventional ball grid array (BGA) semiconductor device package prior to die thinning.
Figure 1B:
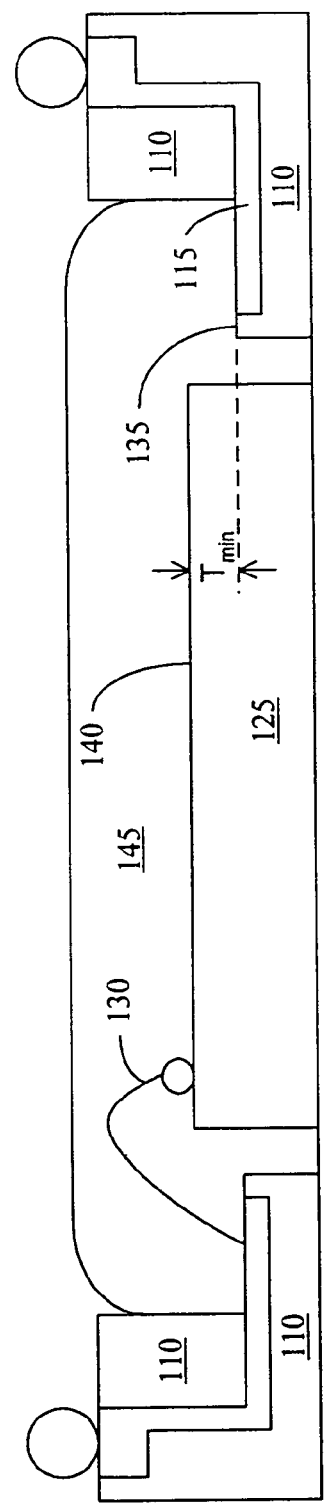
FIG. 1B shows an encapsulated conventional BGA semiconductor device package after die thinning.

A key feature of the packaged semiconductor device 200 is that the package wirebonding surface 235 is located above the surface of the semiconductor die 225, in contrast to the conventional assembly of FIG. 1A and FIG. 1B. Another key feature is that the bottom surface of the semiconductor die 225 is below a bottom surface 204 of the package.

The package shown in FIG. 2 has a first bottom surface 204 and a second bottom surface 207. The bottom surface of the die 225 and the top surface of carrier plate 205 lie between the first bottom surface 204 and the second bottom surface 207.

Figure 1C:
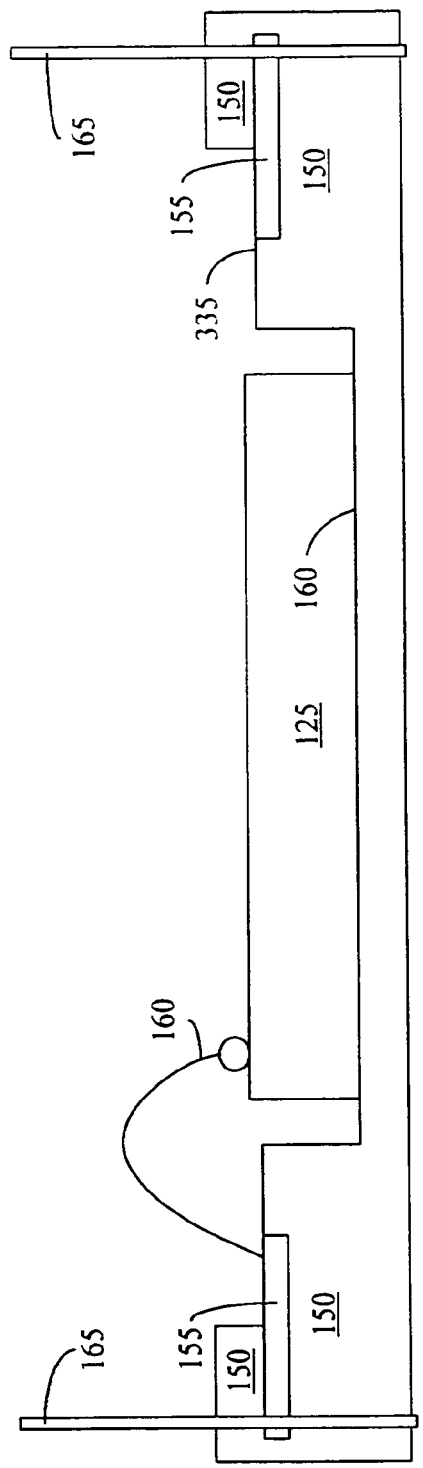
FIG. 1C shows a conventional pin grid array (PGA) package.
Figure 3:
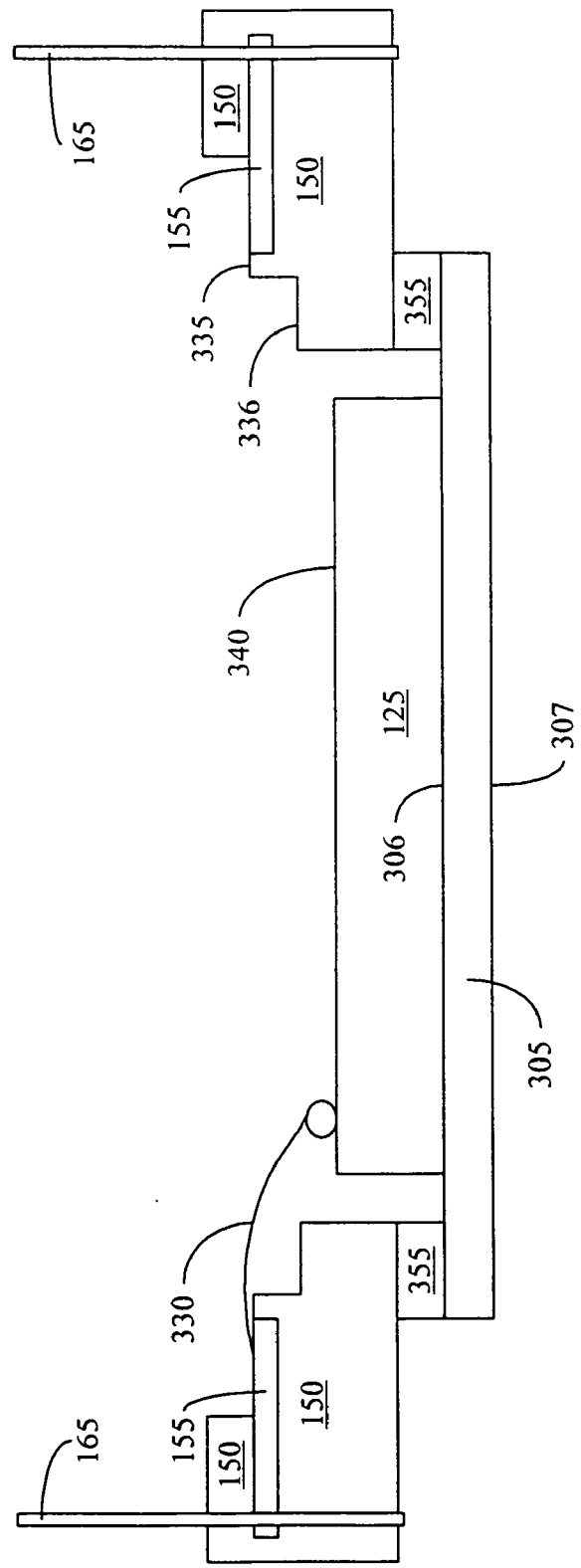
FIG. 3 shows a modified PGA semiconductor device package in accordance with an embodiment of the present claimed invention.

FIG. 3 shows a packaged semiconductor device 300 produced by modifying the conventional pin grid array (PGA) of FIG. 1C in accordance with an embodiment of the present invention. In a first modification a portion of the base 150 is removed to create an opening, and an extension ring 355 is attached to surround the opening in the base 150.

In a second modification a relief 336 may be formed in the base 150 to accommodate a wirebond 330. Since the top surface 340 of the semiconductor die 125 is lowered by the thickness of the extension ring 355, the relief may be required to enable proper wirebonding.

Figure 4:
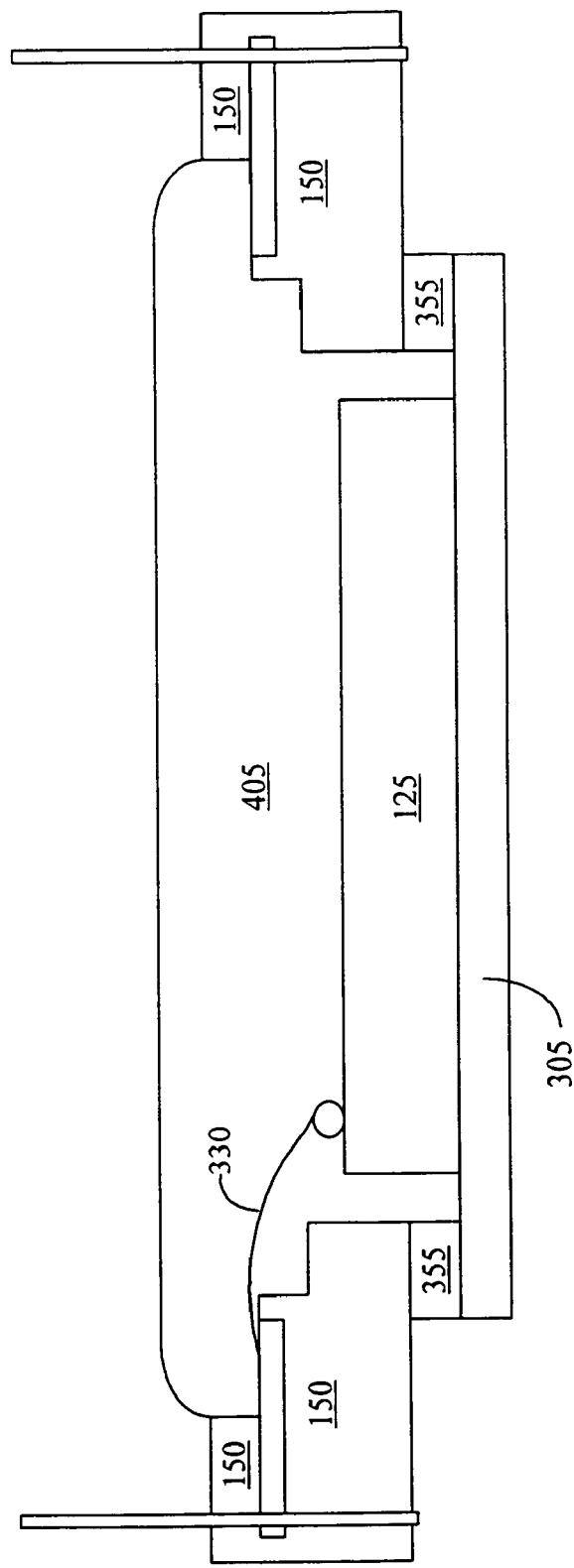
FIG. 4 shows the PGA semiconductor device package of FIG. 3 after encapsulation in accordance with an embodiment of the present claimed invention.

FIG. 4 shows the semiconductor device package after encapsulation in accordance with an embodiment of the present claimed invention. The encapsulant 405 provides protection and support for the semiconductor die 125 and attached wirebond 330. The encapsulant 405 may be a filled polymer (e.g., epoxy) that provides enhanced thermal conductivity, matched thermal expansion, or improved lapping for the semiconductor die 125.

Figure 5:
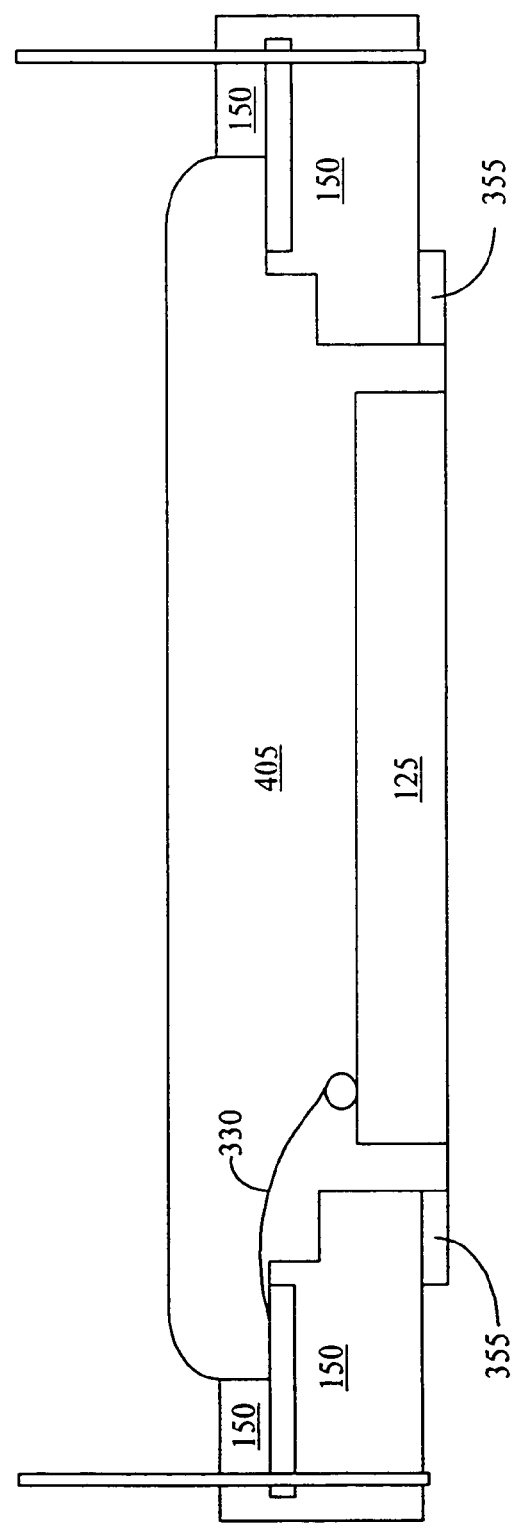
FIG. 5 shows the PGA semiconductor device package of FIG. 4 after lapping in accordance with an embodiment of the present claimed invention.

FIG. 5 shows the packaged semiconductor device FIG. 4 after lapping in accordance with an embodiment of the present claimed invention. The die carrier plate is preferably removed prior to lapping to expose the extension ring 355, encapsulant 405, and semiconductor die 125.

Although the lapped packaged device 500 shows a portion of the extension ring 355 in place after lapping, in other embodiments the extension ring 355 may be removed entirely by lapping.

Figure 6:
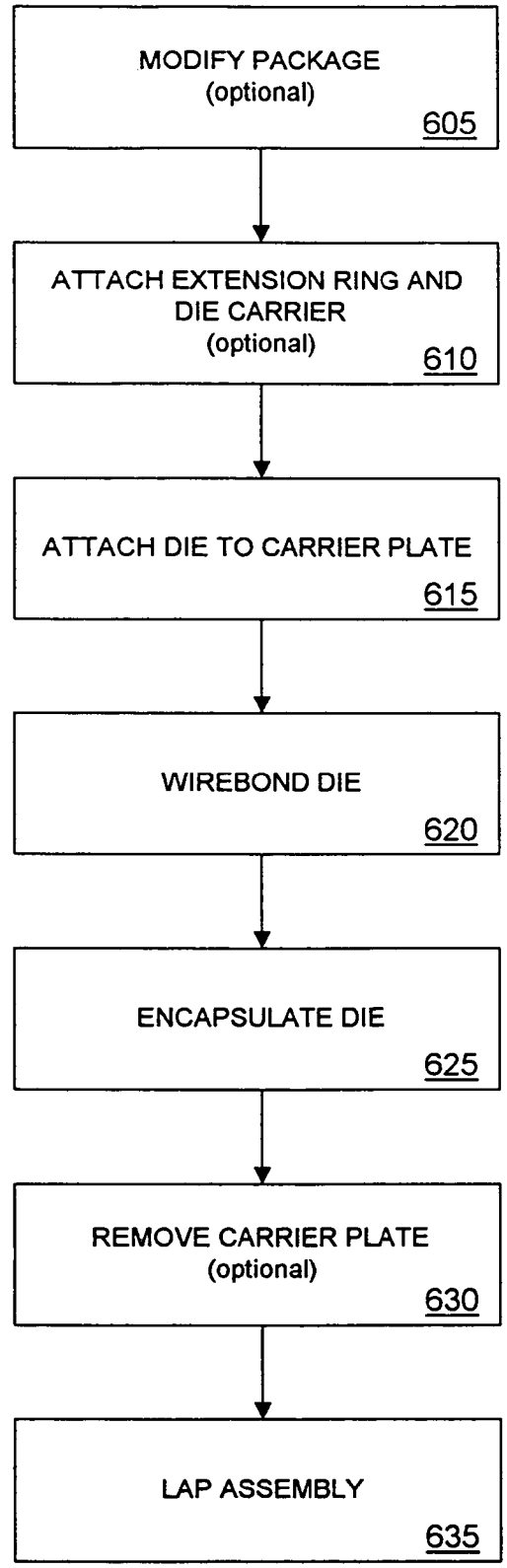
FIG. 6 shows a flow diagram of a method for packaging a semiconductor device in accordance with an embodiment of the present claimed invention.

FIG. 6 shows a flow diagram of a method for packaging a semiconductor device in accordance with an embodiment of the present claimed invention. At step 605, a conventional semi conductor package (e.g., BGA or PGA) is modified. The modification may include forming an opening in the package die mounting region and may also include forming a wirebond relief.

At step 610, an extension ring is attached to surround the opening formed at step 605, and a die carrier plate is attached to the extension ring. Steps 605 and 610 are optional and are not required when using a package that is prefabricated with an extension ring and die carrier plate At step 615, a semiconductor die is attached to the die carrier plate. The attach of the die is preferably done using an adhesive or adhesive tape that is compatible with the wirebonding process anticipated for the die. It is also preferable that the die carrier plate be removable from the die with a small applied force.

At step 620, the die is wirebonded. At step 625 the die is encapsulated with an epoxy, a silicone, or other encapsulant. The encapsulant may include a filler material for modifying properties such as hardness, thermal coefficient of expansion, thermal conductivity, and lapping characteristics.

At step 630, the carrier plate is removed. In general, it is preferable to use a carrier plate that can be removed prior to lapping. However, wirebonding, testing or other operations may require a strong bond between the carrier plate and the die.

At step 635, the assembled die and package are lapped. As used herein, the term "lapping" refers to the mechanical application of one or more abrasives to remove material from the assembled die and package. Lapping may include grinding with a coarse abrasive and/or polishing with a fine abrasive.

Embodiments of the system and method for packaging and lapping a semiconductor die may be used to prepare a device for optical probing or may be used to prepare a device for the attachment of a heat sink to the thinned die after assembly and testing of the device. Thus, the present invention may be used in the course of device evaluation or failure analysis, or in the course of manufacturing.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications suited to the particular use contemplated. It is intended that the scope of the invention be defined by the claims appended hereto and their equivalents.

The invention claimed is:

1. A semiconductor device package comprising:
    a frame having an opening;
    a die carrier plate; and
    an extension ring coupled to a first surface of said frame surrounding said opening and removably attached to a first surface of said die carrier plate.

2. The package of claim 1, wherein said die carrier plate is attached to said extension ring by an adhesive tape.

3. The package of claim 1, wherein said die carrier plate is attached to said extension ring by a temporary adhesive.

4. The package of claim 1, wherein said semiconductor device package is a ball grid array (BGA) package.

5. The package of claim 1, wherein said semiconductor device package is a pin grid array (PGA) package.

6. The package of claim 1, further comprising a semiconductor die removably attached to said die carrier plate.

7. The package of claim 6, further comprising an encapsulant for encapsulating said semiconductor die.

8. The package of claim 7, wherein said encapsulant comprises silicone.

9. The package of claim 7, wherein said encapsulant comprises epoxy.

10. The package of claim 7, wherein said encapsulant comprises a fill material for enhancing the thermal conductivity of said encapsulant.

11. The package of claim 7, wherein said encapsulant comprises a fill material for matching a thermal coefficient of expansion of said semiconductor die.

12. The package of claim 7, wherein said encapsulant comprises a fill material for increasing the hardness of said encapsulant.

13. The package of claim 6, wherein a wirebonding surface of said package is located above a top surface of said semiconductor die.

14. A method for modifying a semiconductor device package comprising:
    forming an opening in a base of said package;
    attaching an extension ring to said base, wherein said extension ring surrounds said opening; and
    attaching a removable die carrier plate to said extension ring.

15. The method of claim 14, wherein said attaching of said die carrier plate to said extension ring is done using a temporary adhesive.

16. The method of claim 14, further including removably attaching a semiconductor die to said die carrier plate.

17. The method of claim 16, wherein said attaching of said semiconductor die to said die carrier plate is done using a temporary adhesive.

18. The method of claim 17, further including encapsulating said semiconductor die.

19. The method of claim 18, further including removing said die carrier plate.

20. The method of claim 19, further including lapping said semiconductor die, said encapsulant and said extension ring.

* * * * *